United States Patent [19]

Moxon

[11] Patent Number: 5,122,675
[45] Date of Patent: Jun. 16, 1992

[54] DIGITAL LINE LOCK CIRCUIT WITH NOISE IMMUNITY

[75] Inventor: Thomas W. Moxon, Milpitas, Calif.

[73] Assignee: VLSI Technology, Inc., San Jose, Calif.

[21] Appl. No.: 596,850

[22] Filed: Oct. 12, 1990

[51] Int. Cl.⁵ .......................... H03K 5/22; H03K 19/00
[52] U.S. Cl. .................................. 307/236; 307/480; 307/443
[58] Field of Search ............... 307/236, 269, 272.2, 307/480.1, 443; 328/118

[56] References Cited

U.S. PATENT DOCUMENTS

| | | | |
|---|---|---|---|
| 3,961,203 | 6/1976 | Hutch | 328/118 |
| 4,473,760 | 9/1984 | Ambrosius, III | 307/481 |
| 4,518,872 | 5/1985 | Backes | 307/269 |
| 4,614,973 | 9/1986 | Sorenson | 307/269 |
| 4,694,196 | 9/1987 | Hasley et al. | 307/269 |
| 4,823,026 | 4/1989 | Hanson | 307/352 |
| 4,939,396 | 7/1990 | Schoettmer | 307/269 |

OTHER PUBLICATIONS

Standard Microsystems Corp. product information sheet, pp. 293-300 on CRT Video Timer and Controller VTAC (No Date).

*Primary Examiner*—David Hudspeth
*Assistant Examiner*—Andrew Sanders
*Attorney, Agent, or Firm*—Hickman, Frazzini & King

[57] ABSTRACT

A transition detector that samples a signal under test only at discrete times determined by a clock signal. By sampling only in discrete intervals instead of continuously, this circuit has a greatly reduced sensitivity to spurious transitions produced by noise in the signal under test. This detector produces an output signal having a narrow pulse at each detected transition.

13 Claims, 2 Drawing Sheets

DIGITAL LINE LOCK CIRCUIT WITH NOISE IMMUNITY

BACKGROUND OF THE INVENTION

This invention relates in general to transition detectors and relates more particularly to a circuit for generating a lock signal for synchronizing video horizontal and vertical synchronization signals with an alternating current power signal.

In the figures, each element indicated by a reference numeral will be indicated by the same reference numeral in every figure in which that element appears. The first two digits of any 4 digit reference numerals and the first digit of any two or three digit reference numerals indicates the first figure in which its associated element is presented.

A cathode ray tube (CRT) operates by directing a modulated beam of electrons across the face of a phosphor coated tube. The electron beam is scanned from left to right and from top to bottom in the same manner as one reads a page. When the beam is returned from right to left (referred to as a "horizontal retrace") or from bottom to top (referred to as a "vertical retrace"), the beam is blanked (i.e., turned off) so that it is not visible during any of these retrace operations. Thus, the electron beam is directed at the CRT along a zig-zag pattern and is turned on only during the portions of the zig-zag pattern that slope from upper left to lower right. Upon completion of this zig-zag pattern, the beam returns to the upper left hand corner of the CRT and the zig-zag scanning process is repeated.

The signal that controls the return of the electron beam from the right to left is referred to as the "horizontal synch" signal. The signal that controls the return of the electron beam from the bottom to the top is referred to as the "vertical synch" signal. The number of times that this scanning process occurs per second is referred to as the "refresh rate" of the CRT. The refresh rate of a CRT is often selected to be a rational multiple of the frequency of an A.C. power signal provided to the CRT. For example, 60 Hertz and 30 Hertz refresh rates are common in the United States.

Unfortunately, when the refresh rate is nearly equal to a rational multiple of the A.C. power signal, a visual interference pattern on the CRT screen results in the form of a brightened band that repeatedly moves vertically across the CRT screen. The frequency at which this pattern scans vertically across the screen is equal to the frequency difference between the frequency of the A.C. power signal and that multiple of the refresh rate that most closely equals the frequency of the A.C. power signal. This effect is referred to as "swimming" and can be eliminated by phase locking the vertical synch signal to the A.C. power signal.

In some CRT video displays, a portion of the A.C. signal is directed through circuitry that reshapes this portion of the A.C. signal into a 60 Hz digital signal that conforms to the logic levels of the video display circuit. The horizontal and vertical signals are phase locked to this digital signal. As illustrated in FIG. 1, this digital signal can be produced by passing a portion of the A.C. power signal through a half wave rectifier 11 to produce an A.C. signal V that varies between 0 and 5 volts. This A.C. signal is applied to the clock input of a D-type flip flop 12 having its $\bar{Q}$ input connected to its D input. This produces at the Q output of the D-type flip-flop a digital output LOCK signal to which the vertical and horizontal synch signals can be locked.

Elements 11 and 12 cooperatively function as a transition detector that detects the zero-to-one transitions of the A.C. power signal. Unfortunately, power spikes in the A.C. line can produce spurious zero-to-one transitions that are detected by the zero-to-one detector, thereby producing in the output signal spurious pulses that disturb the phase lock between the vertical synch signal and the A.C. power signal. Such spikes often occur when motors are activated in devices connected into the same power circuit to which the video display is connected. Common sources of such motors include refrigerators, garbage disposals, and elevators. Some reduction in sensitivity to such power spikes has been achieved by use of a low pass filter in the input power line of a video display. However, to avoid spike-induced interruption of the phase lock between the digital LOCK signal and the vertical synch signal, it would be advantageous to have a zero-to-one detector that has a significantly reduced sensitivity to power spikes in the A.C. power signal.

SUMMARY OF THE INVENTION

In accordance with the illustrated preferred embodiment, a transition detector is presented that is particularly suitable for use in a digital line lock circuit in a CRT video display. In this transition detector, the signal level of a reference INPUT signal is sampled only at times determined by a clock signal. An output pulse is produced in an output signal only if the measured polarity of the reference INPUT signal has changed since the prior sample was taken. Because samples are taken only in short intervals that occur at times determined by the input clock signal, this transition detector will be highly insensitive to spurious transitions occurring at noise spikes in the reference INPUT signal. Indeed, it will generate a spurious output pulse only if a noise spike occurs in one of the short intervals in which the polarity of the reference INPUT signal is sampled. Thus, this transition detector is useful in applications such as video equipment where spurious transitions can disrupt circuit operation.

This noise elimination scheme can be embodied in transition detectors that detect both polarities of transition in the reference signal and can also be embodied in transition detectors that detect only one polarity of transition. These latter transition detectors are referred to as zero-to-one transition detectors and one-to-zero transition detectors.

In accordance with the illustrated preferred embodiment, a zero-to-one transition detector is illustrated that utilizes a first 2-input AND gate having one input connected to the D-input of a first D-type flip-flop and the other input connected to the $\bar{Q}$ output of this D-type flip-flop. This produces a zero-to-one transition at the output of the AND gate only when the reference INPUT signal has made a zero-to-one transition between the prior and the present sampling intervals. The sampling intervals occur at transitions of a reference clock signal applied to the clock input of the AND gate.

A LOCK signal having narrow output pulses at each detected zero-to-one transition is produced by an additional circuit that produces a second polarity transition in the LOCK signal shortly after the output of the first AND gate produces a first polarity transition in its output. In the preferred embodiment, this additional circuit includes an inverter, a NAND gate and a pair of additional D-type flip-flops and produces negative going pulses in the LOCK signal. If the NAND gate is replaced by an AND gate, then the LOCK signal will have positive pulses at the zero-to-one transitions. This circuit is easily converted into a one-to-zero transition detector by the addition of an inverter at the input of this transition circuit.

The LOCK signal is typically utilized to reset a pair of counter chains that are each clocked by a signal of accurate, stable frequency produced by a crystal. One of these counter chains produces the video horizontal synchronism signal HSYNCH and the other produces the video vertical synchronism signal VSYNCH. Because both chains are reset by the LOCK signal, both of these synchronism signals are phase locked to the INPUT signal.

This transition detector not only provides greatly improved immunity to noise spikes, it also is self initializing and can recover from a glitch. That is, regardless of the initial states of signals within this circuit and at an input of this circuit, after 2 clock cycles, a unique circuit state will be established. Therefore, no initialization process needs to be performed at circuit turn-on.

DESCRIPTION OF THE PREFERRED EMBODIMENT

Figure 2:
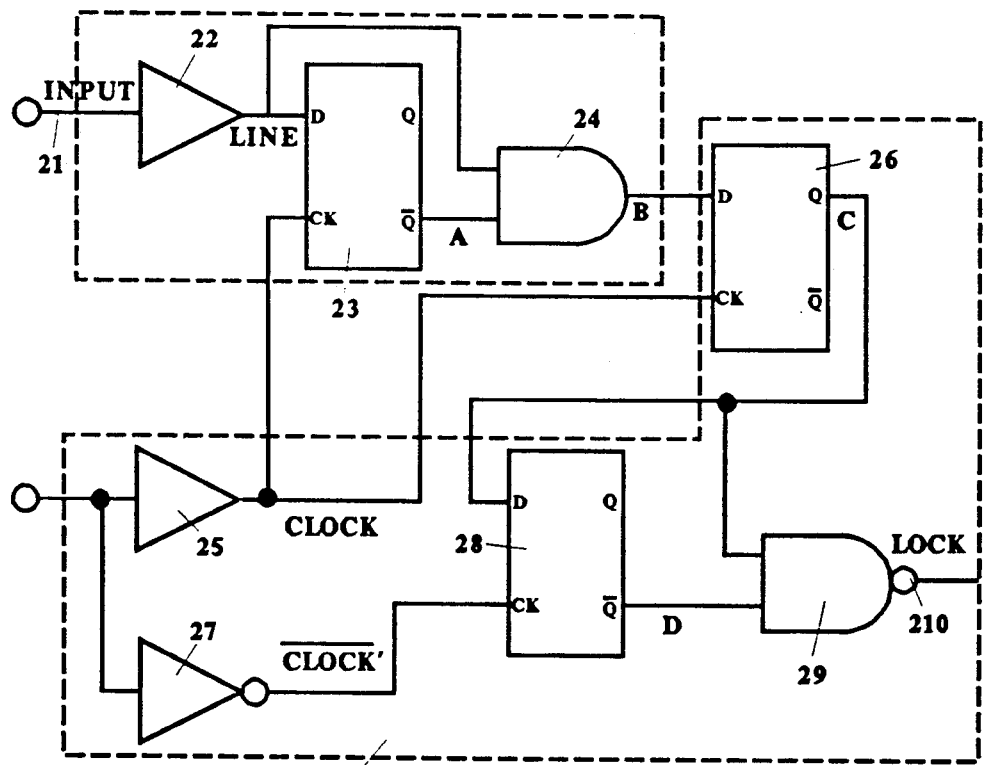
FIG. 2 is a preferred embodiment of a transition detector having reduced noise sensitivity.

FIG. 2 illustrates a preferred embodiment of a transition detector having reduced noise sensitivity. This particular embodiment is intended for use in producing a LOCK signal for use in phase locking the horizontal and vertical synch signals to an input power signal. However, this transition detector is also useful in other applications where spurious transitions caused by noise can disrupt circuit operation.

Figure 1:
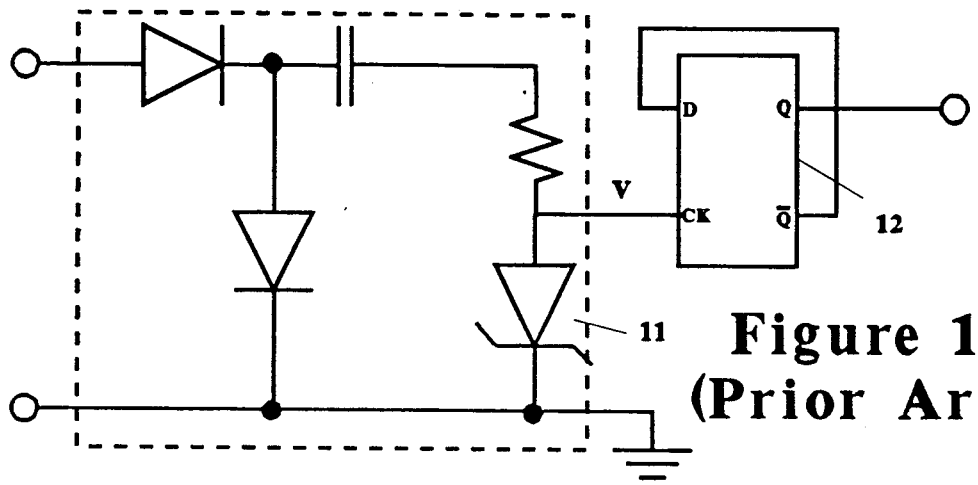
FIG. 1 illustrates a typical zero-to-one detector.

In this embodiment, a portion of a 60 Hz power signal INPUT is applied to an input 21 of a Schmitt trigger 22 to produce a digital signal, referred to as the LINE signal, having voltage levels compatible with typical integrated circuits. The Schmitt trigger performs logic level low and high transitions at inputs voltage values of 0.4 and 2.7 volts, respectively, and therefore enables the use of a larger amplitude reference INPUT signal than could be used with TTL compatible circuits that exhibit transitions at 0.7 and 2.3 volts, respectively. This increase in the difference between the transition values makes the response of the Schmitt trigger less sensitive to noise than is the circuit of FIG. 1.

The output signal LINE of the Schmitt trigger is applied to the D-input of a D-type flip-flop 23 and to a first input of an AND gate 24. A CLOCK signal is supplied through a buffer 25 that, in CMOS embodiments, buffers the signal to 4 loads, thereby reducing the rise time and the fall time of the clock signal. This buffered clock signal is applied to the clock input of D-type flip-flop 23. An output signal A produced at the $\overline{Q}$ output of D-type flip-flop 23 is applied to a second input of AND gate 24. A signal B produced at the output of AND gate 24 is therefore high only when signals LINE and A are both high.

As will be explained in greater detail below and as can be seen in the timing diagram of FIG. 3, the output signal B of AND gate 24 goes high at a CLOCK pulse only if the signal LINE was low at the time of the previous CLOCK pulse and is high at the time of the most recent CLOCK pulse. Therefore, circuit 211, consisting of the above-described configuration of Schmitt trigger 22, D-type flip-flop 23 and AND gate 24, functions as a zero-to-one transition detector.

In this particular embodiment, circuit 212 produces a LOCK signal exhibiting a negative-going pulse at each zero-to-one transition in the INPUT signal. Additional circuit 212 consists of a first buffer 25, a second D-type flip-flop 26, an inverter 27, a third D-type flip-flop 28 and a NAND gate 29 having an output 210 on which is produced the output signal referred to herein as the LOCK signal.

Figure 3:
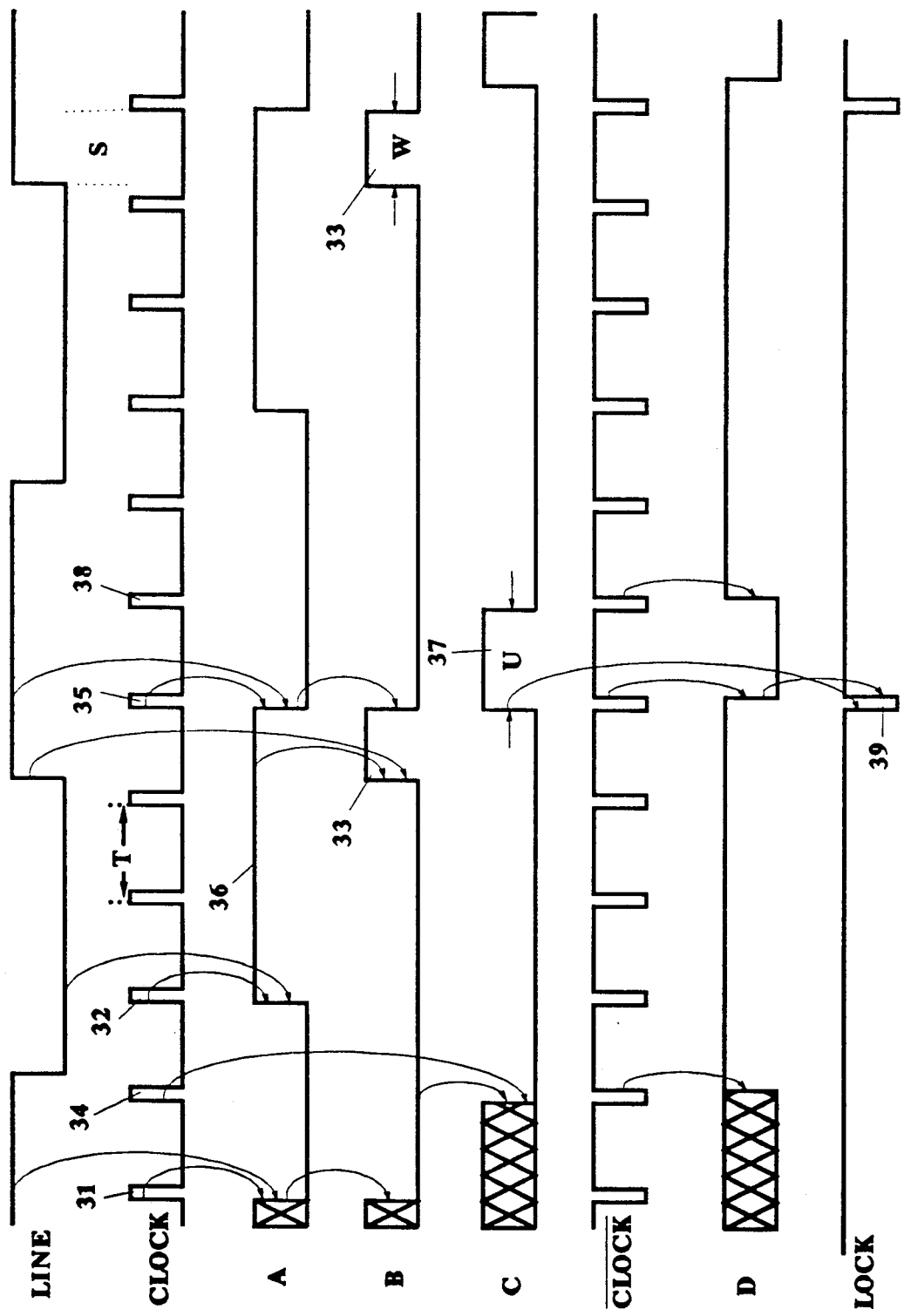
FIG. 3 is a timing diagram for the transition detector of FIG. 2.

The operation of circuit 211 and 212 can be understood by reference to the timing diagram in FIG. 3 which presents the signals of circuits 211 and 212. Pulse 31 is the first CLOCK signal pulse that occurs subsequent to activation of the circuit of FIG. 2. In the example illustrated in FIG. 3, this pulse begins during an interval in which the LINE signal is high. The case in which this pulse occurs during an interval in which the LINE signal is low is completely analagous.

Signal A

Because the LINE signal is high at pulse 31, in response to CLOCK pulse 31 and the LINE signal, the output signal A of D-type flip-flop 23 is driven low. Each rising edge of signal A occurs in response to the rising edge of the first clock pulse (such as pulse 32) following a falling edge of the LINE signal. Each falling edge of signal A occurs in response to the first clock pulse following a rising edge of the LINE signal (e.g., pulse 35). Therefore, the width of each pulse 36 of signal A is an integral multiple of the period of the CLOCK signal.

Signal B

Signal B is high only in those intervals in which both signal A and the LINE signal are high. Thus, when signal A goes low in response to pulse 31, signal B also is forced low. The rising edge of each pulse 33 of signal A occurs in response to a rising edge of the LINE signal because such points represent the start of intervals in which both signals A and B are high. The falling edge of each pulse 33 occurs in response to the first clock pulse (such as pulse 35) that occurs after a rising edge of the LINE signal. Thus, each zero-to-one transition in the LINE signal produces an associated pulse 33 that is closely spaced after its associated zero-to-one transition. Therefore, circuit 211 functions as a zero-to-one detector. This circuit is easily converted to a one-to-zero detector by the inclusion of an inverter at input 21 of circuit 211.

In certain applications, it is necessary that the widths of the output of the transition detector have equal and/or maximal widths. Unfortunately, when the frequency of the CLOCK signal is not a constant integral multiple of the frequency of the LINE signal, then the spacing S will not be the same for every rising edge of the LINE signal. As a result of this, the pulses 33 will not have equal widths W. For those applications in which the widths of the pulses in the output signal of the transition detector must be equal, additional circuit 212 is included to convert signal B into an output LOCK signal that has pulses of equal, controlled width. Circuitry 212 includes a buffer 26, D-type flip-flops 26 and 28, an inverter 27 and a NAND gate 29. The signals C, D and LOCK produced by this additional circuit 212 are also illustrated in FIG. 3.

Signal C

In response to the first clock pulse 34 following clock pulse 31, the low value of signal B forces signal C low. The rising edge of each pulse 37 of signal C is also produced in response to the rising edge of the first clock pulse that occurs after a rising edge of the LINE signal (e.g., pulse 35). Because a falling edge of signal A is also produced in response to this same rising edge, and this falling edge also produces a falling edge of signal B, it is assured that, at the rising edge of the next clock pulse (such as pulse 38), signal B will be low, thereby forcing signal C to go low. Therefore, each pulse 37 has a width U equal to the period T of the CLOCK signal.

Although signal C has pulses of constant width, in many applications, it is important not only that the LOCK signal have constant width pulse but that, in addition, these pulses be relatively narrow. The remaining elements of circuit 212 convert pulses 37 into narrower pulses 39 in the LOCK signal.

Signals D and LOCK

An inverter 27 produces a signal $\overline{CLOCK}$ that is the inversion of the CLOCK signal, delayed slightly by the inversion circuitry in inverter 27. This $\overline{CLOCK}$ signal has rising edges that are delayed from the rising edges of the CLOCK signal by the width P of the pulses of the CLOCK signal. Because a D-type flip-flop 28 is clocked by this $\overline{CLOCK}$ signal, the transitions in signal D are delayed by the interval P relative to associative transitions in signal C. Because signal D is produced at the $\overline{Q}$ output of D-type flip-flop 28, signal D is just an inverted version of signal C, delayed by the pulse width P of the pulse of the CLOCK signal. Therefore, the LOCK signal produced at the output of a NAND gate 210 has a sequence of negative-going, narrow pulses 39 of width P.

The circuit of FIG. 2 is particularly suitable for use in video displays to avoid the swimming effect. This is achieved by utilizing the power signal of the video display as the INPUT signal of FIG. 2 so that the LOCK signal has a pulse 39 at each zero-to-one transition of the power signal. The HSYNCH and VSYNCH signals are phase locked to the LOCK signal thereby indirectly locking these signals to the power signal to the video display, thereby eliminating the swimming effect.

Because circuitry 211 and 212 tests the polarity of the INPUT signal only during each CLOCK pulse, a noise spike can produce a spurious zero-to-one transition only if it occurs during one of the pulses of the CLOCK signal. Therefore, in comparison to previous zero-to-one detectors, this zero-to-one detector will exhibit a fractional reduction in spurious zero-to-one detections proportional to the duty cycle d of the CLOCK signal. The CLOCK signal is selected to have a duty cycle much less than one so that there is a commensurately large increase in noise immunity. In the preferred embodiment, the HSYNCH signal is utilized as the CLOCK signal in the circuits 211 and 212.

I claim:

1. A digital line lock circuit for producing a digital LOCK signal of frequency equal to a frequency f of a periodic analog INPUT signal, said digital line lock circuit comprising:
   a source of a periodic CLOCK signal having a plurality of pulses;
   transition detection means, responsive to said INPUT signal and to said CLOCK signal, for detecting the polarity of said analog INPUT signal only at the occurrences of said pulses in the CLOCK signal and for producing said LOCK signal that indicates each occurrence of a change of detected polarity from a first polarity to a second polarity.

2. A digital line lock circuit as in claim 1 further comprising:
   means for phase locking a digital synchronization signal to said LOCK signal, whereby a synchronization signal is produced that can be utilized within a video display to control a refresh rate.

3. A digital line lock circuit as in claim 2 wherein said digital synchronization signal is a video horizontal synchronization signal HSYNCH.

4. A digital line lock circuit as in claim 2 wherein said digital synchronization signal is a video vertical synchronization signal VSYNCH.

5. A digital line lock circuit as in claim 1 wherein said transition detection means comprises:
   a D-type flip-flop having a D input responsive to said INPUT signal, having a clock input CK connected to said source of the CLOCK signal and having a $\overline{Q}$ output; and
   an AND gate having a first input connected to the D input of said D-type flip-flop, having a second input connected to the $\overline{Q}$ output of D-type flip-flop and having an output on which the signal LOCK is produced.

6. A transition detector as in claim 1 further comprising:
   means for phase locking a digital synchronization signal to said LOCK signal, whereby a synchronization signal is produced that can be utilized within a video display to control a refresh rate.

7. A transition detector for detecting transitions in an INPUT signal, said transition detector comprising:
   a source of a periodic CLOCK signal having a plurality of pulses;
   transition detection means, responsive to said INPUT signal and to said CLOCK signal, for detecting the polarity of said INPUT signal only at the occurrences of said pulses in the CLOCK signal and for producing a signal B that indicates each occurrence of a change of detected polarity from a first polarity to a second polarity, wherein said transition detection means produces a signal B having a pulse at each detected change of the polarity of the INPUT signal from said first polarity to said second polarity; and
   means, responsive to said signal B, for producing a signal C having pulses of equal pulse width, each of which has a leading edge produced in response to a pulse in signal B.

8. A transition detector as in claim 7 wherein said means for producing signal C is a D-type flip-flop having a D input responsive to signal B, having a clock input CK responsive to the CLOCK signal and having an output on which is produced the signal C.

9. A transition detector as in claim 6 further comprising:
   means, responsive to signal B for producing from signal B an output signal LOCK having pulses of pulsewidth equal to a pulsewidth of said CLOCK signal, each of these pulses in the LOCK signal having a leading edge produced in response to a pulse in signal B.

10. A transition detector as in claim 9 wherein said means for producing the LOCK signal comprises:
- a first D-type flip-flop having a D input responsive to signal B, having a clock input CK responsive to the CLOCK signal and having an output on which is produced the signal C;
- a source of a $\overline{\text{CLOCK}}$ signal having a plurality of pulses
- a second D-type flip-flop having D input responsive to signal C, having a clock input CK responsive to the $\overline{\text{CLOCK}}$ signal and having an output on which is produced a signal D; and
- an AND gate having a first input responsive to signal C, a second input responsive to signal D and an output on which is produce the LOCK signal.

11. A transition detector as in claim 9 wherein said means for producing the LOCK signal comprises:
- a first D-type flip-flop having a D input responsive to signal B, having a clock input CK responsive to the CLOCK signal and having an output on which is produced the signal C;
- a source of a $\overline{\text{CLOCK}}$ signal having a plurality of pulses;
- a second D-type flip-flop having a D input responsive to signal C, having a clock input CK responsive to the $\overline{\text{CLOCK}}$ signal and having an output on which is produced a signal D; and
- an AND gate having a first input responsive to signal C, a second input responsive to signal D and an output on which is produce the LOCK signal.

12. A digital line lock circuit as in claim 1 wherein said analog INPUT signal is an alternating current power signal.

13. A digital line lock circuit as in claim 2 wherein said analog INPUT signal is an alternating current power signal, whereby said synchronization signal is phase locked to the INPUT signal.

* * * * *